United States Patent [19]

Futakawa et al.

[11] 4,261,206
[45] Apr. 14, 1981

[54] FAULT DIAGNOSTIC DEVICE FOR WINDING OF ELECTRIC MACHINERY AND APPARATUS

[75] Inventors: Akemi Futakawa; Tokio Fukunaga; Tsutomu Tani, all of Amagasaki, Japan

[73] Assignee: Mitsubishi Denki Kabushiki Kaisha, Tokyo, Japan

[21] Appl. No.: 62,820

[22] Filed: Aug. 1, 1979

[30] Foreign Application Priority Data

Aug. 18, 1978 [JP] Japan ................... 53-101120
Aug. 25, 1978 [JP] Japan ................... 53-104002

[51] Int. Cl.³ .................................. G01M 7/00
[52] U.S. Cl. .......................... 73/579; 73/593
[58] Field of Search .......... 73/576, 579, 593, 570, 73/662, 116; 340/648; 324/158 MG

[56] References Cited

U.S. PATENT DOCUMENTS

| 2,384,987 | 9/1945 | Dudley | 73/662 |
| 2,648,979 | 8/1953 | Cornett | 73/579 |
| 2,857,757 | 10/1958 | Kendig et al. | 73/579 |
| 3,913,084 | 10/1975 | Bollinger et al. | 73/683 |
| 4,165,458 | 8/1979 | Koizumi et al. | 235/92 PE |

OTHER PUBLICATIONS

Japanese Applications 42,661 & 42,662 of 1976, Published Oct. 1977.
"Vibration Analysis as an Aid to the Detection and Diagnosis of Faults in Rotating Machinery", by E. Downham, Institute of Mechanical Engineers, C192/1976, pp. 223-229.
"Mechanical Fatigue Characteristics of High Voltage Generator Insulation", by Futakawa et al., IEEE Trans. of Electrical Insulation, vol. EI13, No. 6, pp. 395-402, Dec. 1978.

Primary Examiner—James J. Gill
Attorney, Agent, or Firm—Oblon, Fisher, Spivak, McClelland & Maier

[57] ABSTRACT

A fault diagnostic device comprises vibrating means for vibrating a winding by feeding current having a predetermined frequency; detecting means for detecting physical value given in said winding by the vibration; and indicating means for indicating the result of the detection by said detecting means whereby a diagnosis of fault can be performed in high reliability.

12 Claims, 10 Drawing Figures

FAULT DIAGNOSTIC DEVICE FOR WINDING OF ELECTRIC MACHINERY AND APPARATUS

BACKGROUND OF THE INVENTION

1. FIELD OF THE INVENTION

The present invention relates to a fault diagnostic device for a winding of an electric machinery and apparatus for detecting fault or undesired holding condition of the winding of the electric machinery and apparatus (hereinafter referring to as electric instrument) such as a winding in a stator, a rotor or an armature of a rotary electric machine.

2. DESCRIPTION OF THE PRIOR ART

Recently, it is significant to improve electric instrument such as rotary electric machines in view of an increase of a capacity of an electric instrument and a compact light weight size. Thus, windings of the electric instruments should be used in severe conditions. In such conditions, higher reliability is required for electric instruments especially rotary electric machines in view of power demands and supply shortage and prolonged period for periodical inspection, etc.

On the other hand, an increase of a capacity of a rotary electric machine and a prolonged period for exchange of a rotary electric machine should be considered in view of economical depression. Superannuated (overaged) rotary electric machines have been used.

It is quite important to perform diagnoses of fault of windings or undesired holding condition of windings by non-destructive inspection in view of confirmation of reliability of windings of old instruments and fault prevention and maintenance thereof.

In the diagnoses of fault of windings of electric instruments such as rotary electric machines, appearance inspections, hammering inspection, etc. have been carried out so as to find fault of the windings. Therefore, in the inspection, it mostly depends upon operator's experience. In such manner, it is not enough to give objectivity of informations or data for finding fault of the windings. It is difficult to measure directly values for functions and accordingly, various methods of finding substituted values have been carried out. Therefore, it has required to work for experimental measurements for a long period in order to consider it from certain data by inductive methods. There is no possibility to estimate a feature condition by the result of consideration of data measured for the inspection or the study of the condition.

SUMMARY OF THE INVENTION

It is an object of the present invention to provide a fault diagnostic device for a winding which is used for detecting fault of the winding or undesired holding condition of the winding by non-destructive inspection by forcibly vibrating the winding by feeding a specific current to the winding and detecting sudden variation of mechanical force caused by non-linear vibration or collision vibration of the winding whereby the diagnosis of the fault or the undesired holding condition of the winding at the manufacture of an electric instrument or after driving it for a long period can be performed and accordingly the reliability of the electric instrument is increased and the fault prevention and maintenance of the electric instrument can be attained.

It is another object of the present invention to provide a fault diagnostic device for a winding which is used for diagnoses in high reliability by forcibly vibrating the winding by feeding a specific current to the winding; detecting sudden variation of shift caused by non-linear vibration or collision vibration of the winding and finding the fault or the undesired holding condition of the winding.

DETAILED DESCRIPTION OF THE PREFERRED EMBODIMENTS

Figure 1A:
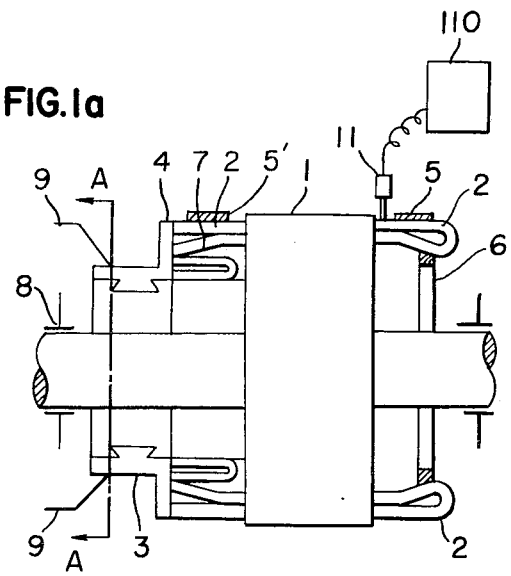
FIGS. 1a and 1b present schematic views of one embodiment of a fault diagnostic device for an armature winding of a DC machine of the present invention.

Referring to the drawings, certain embodiments of the present invention will be illustrated.

Figure 1B:
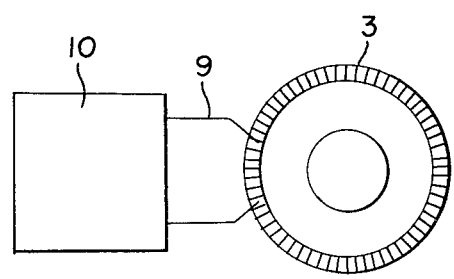

FIG. 1 shows one embodiment of a fault diagnostic device for a winding of a rotary machine of the present invention. In the embodiment, a diagnosis of fault of an armature winding of a direct current machine.

Referring to FIG. 1, the reference numeral (1) designates an armature body; (2) designates an armature winding; (3) designates a commutator; (4) designates a riser for connecting the armature winding (2) to the commutator (3); (5) designates a glass band for preventing deformation of the armature winding by centrifugal force; (6) designates a holder for the armature winding (2); (7) designates a uniform pressure coil; and (8) designates a bearing.

A power circuit (10) of the device of the present invention is connected through a lead-in wire (9) to the commutator (3) of the armature as shown in FIG. 1. The power source (10) can feed an AC current to the armature winding (2) only for a predetermined period. Forced vibration is caused in the armature winding (2) by the AC current and the vibration of the armature winding (2) is detected by an accelerometer (11) which is fixed on or pushed to the armature winding. The result is shown in an oscilloscope (110) as an indicator.

As it is clear from said description, the power source (10) comprises vibrating means for forcibly vibrating the armature winding (2) by feeding an AC current to the armature winding (2). The accelerometer (11) can be a piezoelectric device.

Figure 2:
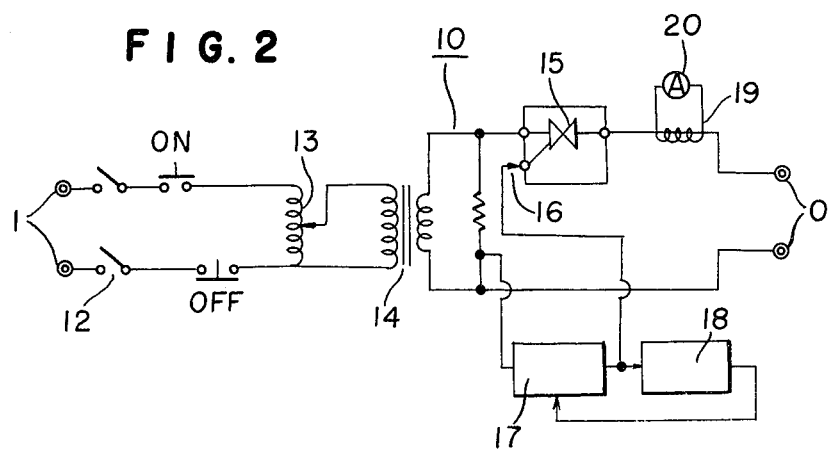
FIG. 2 is a circuit diagram of a power source in FIG. 1.
Figure 3:
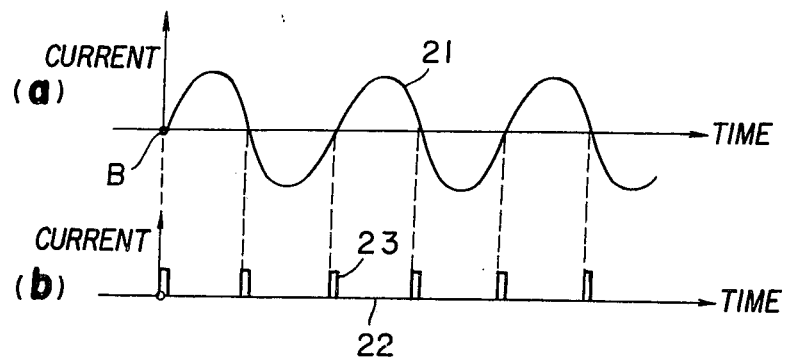
FIG. 3 is a diagram of a current waveform and a pulse waveform.

The vibrating means of the power source (10) of the fault diagnostic device of the present invention will be further described. FIG. 2 is a circuit diagram of one embodiment of the power source (10); and FIG. 3 is a diagram of an output current waveform given by the power circuit (10) and a pulse waveform for the current passing through a counter (48) 18 on the abscissa for time.

As shown in FIG. 2, the power source (10) comprises a switch (12), a slide type transformer (13), a power transformer (14), a thyristor (15), a gate (16), a turn-on control circuit (17), a counter (18), a current transformer (19) and an ampere meter (20). The references I and O respectively designate an input terminal and an output terminal.

In the power source (10), the slide type transformer (13) connected to the primary winding of the power transformer (14) is controlled to adjust an amplitude of the current passed through the armature winding (2). Therefore, the slide type transformer (13) is means for adjusting the amplitude of the output of the vibrating means.

On the other hand, phase of the current at the initiation can be controlled by the thyristor (15) and the turn-on control circuit (17). That is, a phase angle controlling means is formed by the thyristor (15) and the turn-on control circuit (17).

The B point in the current waveform (21) shown in FIG. 3 designates a closing time. In FIG. 3, the current phase is zero at the closing time. In general, the closing phase is adjustable in a range of from zero to 180 degress.

The counter (18) counts the pulses (23) generated by the turn-on control circuit (17) at each time being zero of the current as shown in the pulse waveform (22) in FIG. 3. Current cycles during passing the current are determined by the pulses (23). The generation of the pulses by the turn-on control circuit (17) is stopped to break the current for diagnosis which is fed to the armature winding (2) when predetermined cycles are given. The current for diagnosis which is over a rating current is passed so as to cause easily forced vibration of the winding of the rotary machine for the diagnosis of fault. Therefore, the period for passing the current should be short to prevent overheating of the winding.

The diagnosis of fault of the armature winding by the fault diagnostic device of the present invention will be illustrated.

The power source (10) is connected to the armature (3) as shown in FIG. 1 and the cycles of the current for passing to the armature winding (2) are set in a predetermined value.

The switch (12) in FIG. 2 is closed, and the current passing through the armature winding (2) is measured by the ampere meter (20) and the vibration acceleration in the armature winding (2) is measured by the accelerometer (11). The operation is repeated by controlling the slide type transformer (13) whereby suitable vibration of the armature winding is caused. A sudden change in the acceleration waveform for the armature winding (2) is detected. In accordance with the detection, it is possible to find certain faultof the armature winding holding condition in slots in a DC machine which is newly prepared. It is also possible to find fault of the armature winding (2) or fault of the armature winding holding condition in slots in a DC machine which is driven for a long period, by detecting a sudden change in the acceleration waveform for the armature winding (2) or comparing acceleration waveforms measured after the driving for a long period with that of the initial time.

The principle of the diagnosis of fault of the winding by the device of the present invention will be illustrated.

Figure 4:
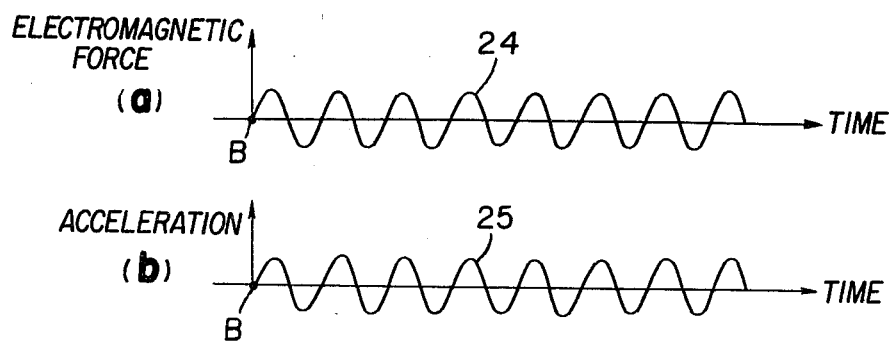
FIG. 4 is a diagram for comparing electromagnetic force in the case of no fault in the winding with vibration acceleration formed in the winding.

FIG. 4 shows an electromagnetic waveform (24) and an acceleration waveform (25) when the armature winding (2) has no fault and is held in the slot in a suitable condition.

When no fault is found in the armature winding (2) and the armature winding (2) is held in a suitable condition, the acceleration waveform (25) is the sine waveform corresponding to the electromagnetic waveform (24) in the armature winding (2). The electromagnetic waveform (24) is given by the consideration that it is the same as the diagnostic current waveform in its principle.

Figure 5:
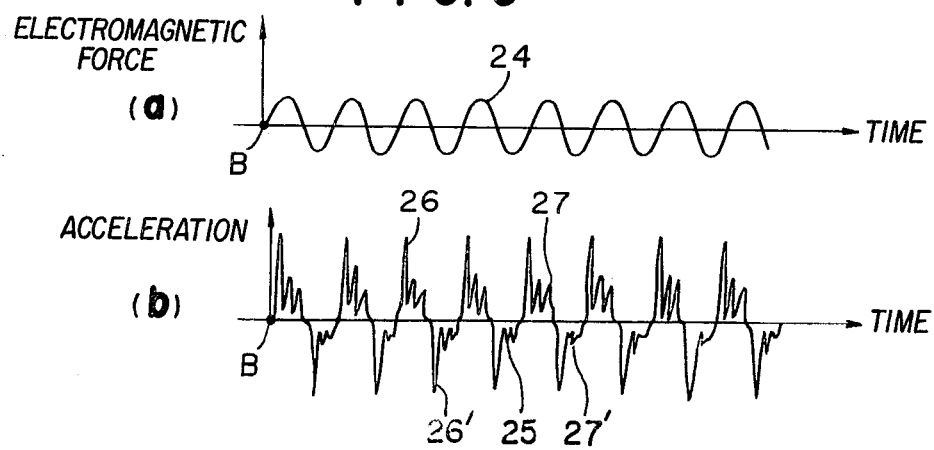
FIG. 5 is a diagram for comparing electromagnetic force in the case of fault in the winding with vibration acceleration formed in the winding.

FIG. 5 shows an electromagnetic waveform (24) and an acceleration waveform (25) when a void is formed in the inner part of the armature winding (2) or the armature winding (2) is held in the slot in the undesired holding condition.

When the void is formed in the armature winding (2) or the armature winding is held in the slot in the undesired holding condition as shown in FIG. 5, the armature winding (2) causes non-linear vibration or collision vibration in the slot whereby pulse acceleration variations (26), (26') for sudden change are formed on the fundamental waveform corresponding to the electromagnetic waveform (24), in the oscilloscope (110). The pulse acceleration variations (26), (26') are formed at each time of vibrating the armature winding (2) in the direction of the wedge or in the direction of the slot bottom. After the pulse acceleration variations (26), (26'), an acceleration variation (27) having high frequency such as 2-3 cycles is formed. Therefore, the fault of the armature winding (2) or the undesired holding condition of the armature winding (2) can be found from the sudden change of the waveform by measuring the variation of the acceleration waveform (24) for the armature winding (2).

This embodiment of the present invention shows that the fault of the armature winding (2) or the undesired holding condition of the armature winding (2) are detected by the sudden change of the acceleration of the armature winding (2). The sudden change of the load or the strains of the wedge caused by collision of the armature winding (2) to the wedge or the bottom of the slot is also found. Therefore, the fault of the armature winding (2) can be also detected by detecting the load or the strain of the wedge.

In the embodiment shown in FIGS. 1 to 5, the fault of the armature winding or the undesired holding condition is detected by the displacement of the armature winding. It is possible to calculate the displacement measured by integrating the acceleration signal through an integration circuit after measuring the acceleration signal by fixing an acceleration detector on the armature winding.

Referring to FIGS. 6-9, the other embodiment of the present invention will be illustrated.

In the embodiment, a displacement pick-up for detecting the displacement of the winding is used as the vibration of detecting means. The other structure is substantially the same as that of the former embodiment.

Therefore, referring to FIG. 2, only one embodiment of the vibration detector (11) for the winding will be illustrated.

Figure 6:
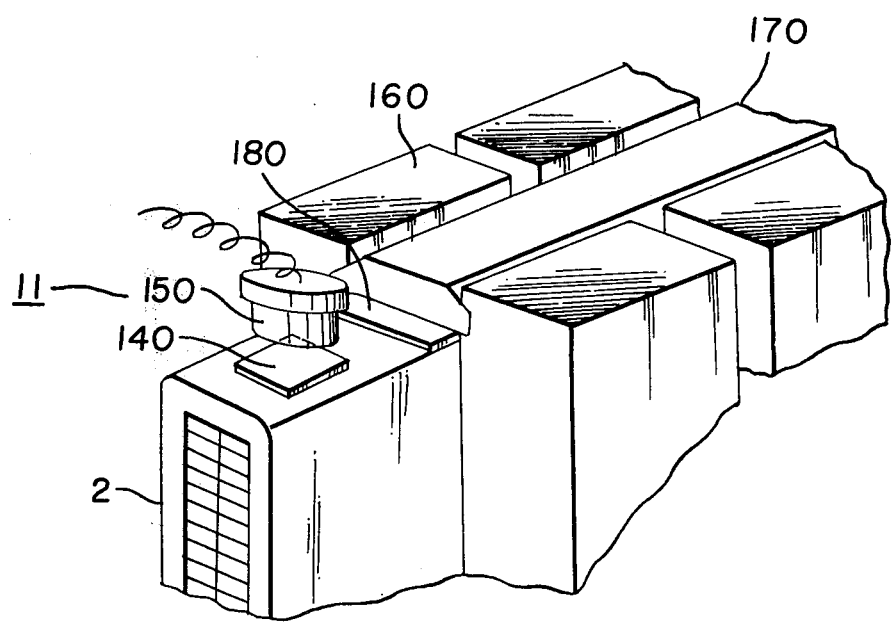
FIG. 6 is a partially enlarged schematic view of one embodiment of the winding vibration detecting part in its operation.
Figure 7:
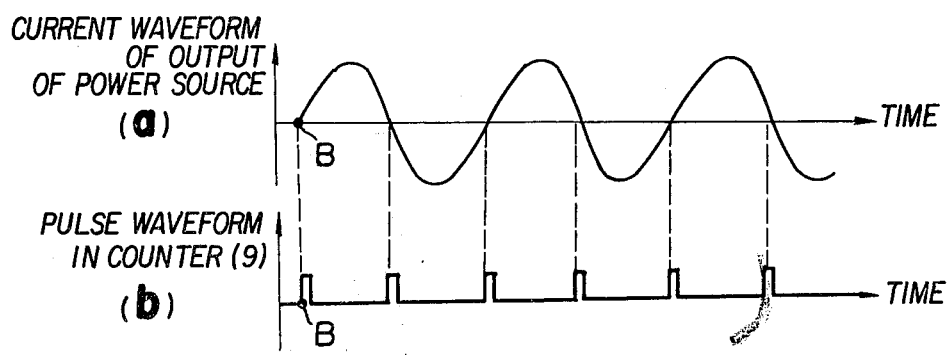
FIG. 7 (a), (b) is a time chart for showing waveforms at different parts in the power source.

FIG. 6 is a partially broken schematic view which shows an edge part of the armature winding.

In FIG. 6, a metal foil (140) is adhered on one end of the armature winding (2) and a displacement pick-up (150) is held by a holder (not shown) to be brought in non-contact with the metal foil (140). When an electromagnetic induction type device is used for the displacement pick-up (150), a magnetic substance is used for the metal foil (140).

When a capacity-type displacement pick-up is used, an electric conductive material is used for the metal foil (140) and the other electrode is formed by facing to the electrode and the displacement of the armature is detected by the variation of the electrostatic capacity.

In FIG. 6, the reference numeral (160) designates an armature core; (170) designates a wedge for fixing the armature winding in the slot; (180) designates a filler for preventing free-movement of the wedge (170).

The operation of the fault diagnostic device of this embodiment is substantially the same as that of the former embodiment and the description is not repeated. Thus, the detected waveforms are modified as shown in FIGS. 8 and 9 depending upon the waveforms at the parts of the power source shown in FIG. 7.

Figure 8:
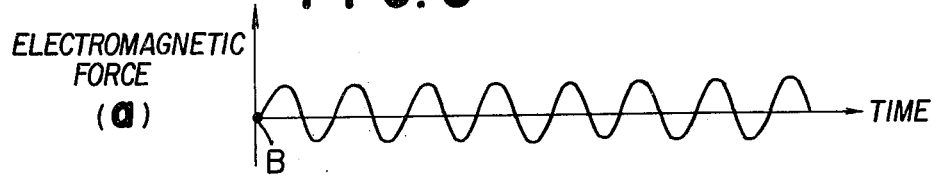
FIG. 8 (a), (b) is a time chart for showing variation electromagnetic force and displacement of the armature winding in time in the normal state.

FIGS. 8 (a), (b) show variation of the electromagnetic force and waveform for the displacement of the armature winding in the case that the armature winding has not any fault and the armature winding is held in the slot in the desired condition.

In this case, it is the sine wave displacement which corresponds to the variation of the electromagnetic force.

Figure 9:
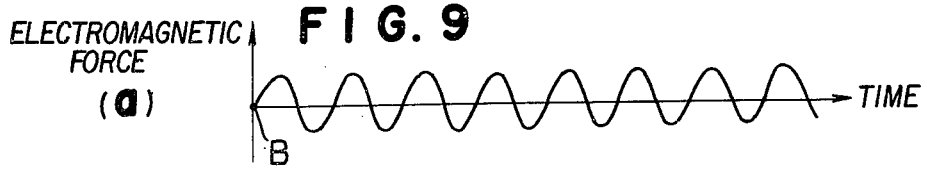
FIG. 9 (a), (b) is a time chart thereof in the fault.
Figure 9:
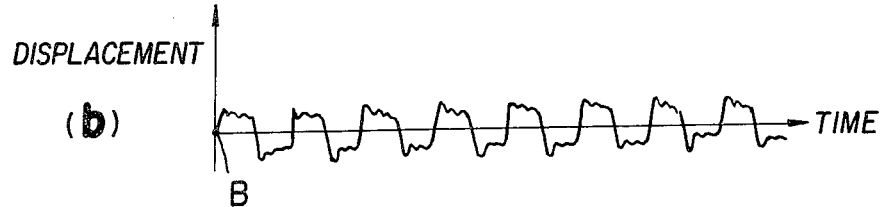

FIGS. 9 (a), (b) show variation of the electromagnetic force and waveform for the displacement of the armature winding in the case that a void is formed in the armature winding or the armature winding is held in the slot in the undesired holding condition.

In such fault, non-linear vibration or collision vibration of the armature winding in the slot is caused. Therefore, small vibrations are overlapped to the fundamental waveform corresponding to the variation of the electromagnetic force as shown in FIG. 9 (b) by the displacement of the armature winding. This is called a plateau phenomenon. Thus, the diagnosis of the fault of the armature winding or the undesired holding condition of the armature winding can be attained from the shift waveform by measuring the displacement of the armature winding (2) as that of the former embodiment.

In said embodiments, the diagnosis of fault of the armature windings of the DC machines have been illustrated. Thus, the fault diagnostic device of the present invention is also effective for detecting fault of a winding of another rotary machine such as a dynamo or an induction motor.

As it is clearly understood in its principle, the device of the present invention can be used for the diagnosis of fault of stationary electric instruments having a winding such as a transformer as well as the rotary machine.

In these embodiments, the AC power source (10) is used. Thus, it is also possible to attain the diagnosis of fault in the case that a predetermined frequency is given in the waveform even though the current having a half-wave rectified waveform is passed to the armature winding (2).

We claim:

1. A fault diagnostic device for a winding of an electric instrument which comprises vibrating means for forcibly vibrating said winding of the electric instrument by feeding current having a predetermined frequency thereto; detecting means for directly detecting vibration acceleration of said winding by the forced vibration caused by said vibrating means and for outputting an electrical signal indicative of the detected vibration; said vibrating means comprising phase angle controlling means which adjusts a phase angle at the time of initiating the feeding of the current to said winding; and indicating means for indicating the result of the detection by said detecting means.

2. The fault diagnostic device according to claim 1 wherein said indicating means indicates the result of the detection by said detecting means as a waveform.

3. The fault diagnostic device according to claim 2 wherein said detecting means is a piezoelectric detector for converting the mechanical force caused by the force vibration of said winding into an electric signal depending upon the value of the mechanical force and outputting the electric signal.

4. The fault diagnostic device according to claim 2 wherein said vibrating means feeds an AC current to said winding.

5. The fault diagnostic device according to claim 2 wherein said electric instrument is a rotary machine.

6. The fault diagnostic device according to claim 1 wherein said phase angle controlling means comprises a turn-on pulse generator for controlling a phase angle at the time initiating the feeding of the current to said winding by generating turn-on pulse at each cycle of the output of said vibrating means and a counter for counting number of the turn-on pulses and stopping the feeding of the current to said winding by transmitting an operation stopping signal to said turn-on pulse generator when the counter value reaches to a predetermined value.

7. The fault diagnostic device according to claim 1 wherein said detecting means is a displacement detector for detecting a displacement of said winding.

8. The fault diagnostic device according to claim 7 which further comprises amplitude controlling means for controlling an amplitude of output voltage of the feeding current which originates from a power source.

9. The fault diagnostic device according to claim 8 wherein said phase angle controlling means controls the phase angle at the time of generating the output voltage by generating turn-on pulses at each cycle and comprises a counter for counting turn-on pulses which allows the feeding of the power to be stopped after counting a predetermined number of pulses.

10. The fault diagnostic device according to claim 8 wherein said power source is an AC power source.

11. The fault diagnostic device according to claim 7 or 8 wherein said electric instrument is a rotary electric machine.

12. The fault diagnostic device according to claim 7 or 8 wherein said indicating means indicates the result of detection by said detecting means as a waveform.

* * * * *